(12) United States Patent
Friza et al.

(10) Patent No.: US 8,575,037 B2
(45) Date of Patent: Nov. 5, 2013

(54) METHOD FOR FABRICATING A CAVITY STRUCTURE, FOR FABRICATING A CAVITY STRUCTURE FOR A SEMICONDUCTOR STRUCTURE AND A SEMICONDUCTOR MICROPHONE FABRICATED BY THE SAME

(75) Inventors: Wolfgang Friza, Villach (AT); Thomas Grille, Villach (AT); Klaus Muemmler, Arriach (AT); Guenter Zieger, Villach (AT); Carsten Ahrens, Pettendorf (DE)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 12/979,104

(22) Filed: Dec. 27, 2010

(65) Prior Publication Data

US 2012/0161257 A1 Jun. 28, 2012

(51) Int. Cl.
  *H01L 21/31* (2006.01)
  *H01L 21/469* (2006.01)

(52) U.S. Cl.
  USPC .......................................... 438/761; 438/778

(58) Field of Classification Search
  USPC .......... 438/99, 669, 758, 767, 763, 778, 780,
      438/942, 951, FOR. 385, FOR. 388,
      438/FOR. 395, FOR. 455; 257/E21.034,
      257/E21.235, E21.587
  See application file for complete search history.

(56) References Cited

U.S. PATENT DOCUMENTS

| | | | |
|---|---|---|---|
| 5,190,807 A * | 3/1993 | Kimock et al. | 428/216 |
| 7,327,003 B2 | 2/2008 | Martin et al. | |
| 2002/0181725 A1 | 12/2002 | Johannsen et al. | |
| 2007/0222007 A1 | 9/2007 | Van Beek et al. | |
| 2009/0134513 A1 * | 5/2009 | Qiu | 257/734 |
| 2009/0207879 A1 * | 8/2009 | Kurashina | 374/133 |

FOREIGN PATENT DOCUMENTS

EP  2 199 252 A1  12/2008

OTHER PUBLICATIONS

Scheeper, P.R., et al., "A Review of Silicon Microphones," Sensors and Actuators A 44, Review Paper, 1994, 11 pages, Elsevier.
Burhanuddin, Y. M., "Fabrication of MEMS," MEMS Technology Seminar, May 25-27, 2005, 35 pages, Putrajaya, Malaysia.
Sha-Li, S., et al., "A Novel Method for Sacrificial Layer Release in MEMS Devices Fabrication," Chinese Physical Society and IOP Publishing Ltd., 2010, 7 pages, vol. 19, No. 7.
Zengerle, R., "Surface Micromachining," Micro-System Technology of Processes, 34 pages.
Zengerle, R., "Micro-system technology: technologies & processes," Mikrosystemtechnik: Technologien & Prozesse, Chapter 7.3, 2008, 34 pages.

* cited by examiner

*Primary Examiner* — Olik Chaudhuri
*Assistant Examiner* — Quovaunda V Jefferson
(74) *Attorney, Agent, or Firm* — Slater & Matsil, L.L.P.

(57) ABSTRACT

Embodiments show a method for fabricating a cavity structure, a semiconductor structure, a cavity structure for a semiconductor device and a semiconductor microphone fabricated by the same. In some embodiments the method for fabricating a cavity structure comprises providing a first layer, depositing a carbon layer on the first layer, covering at least partially the carbon layer with a second layer to define the cavity structure, removing by means of dry etching the carbon layer between the first and second layer so that the cavity structure is formed.

25 Claims, 14 Drawing Sheets

METHOD FOR FABRICATING A CAVITY STRUCTURE, FOR FABRICATING A CAVITY STRUCTURE FOR A SEMICONDUCTOR STRUCTURE AND A SEMICONDUCTOR MICROPHONE FABRICATED BY THE SAME

TECHNICAL FIELD

Embodiments of the invention concern a method for fabricating a cavity structure, e.g. for forming a cavity structure for a semiconductor device. Several embodiments concern the fabrication of a semiconductor structure and the fabrication of a cavity structure for a semiconductor microphone. Furthermore embodiments relate to a semiconductor microphone which is fabricated using the methods described herein.

The fabrication of a cavity structure, a cavitation or a hollow structure may be an important part during the manufacturing process of a device or device structure. Such a device or device structure may be, for example, used in the field of mechanics, electronics, optics or in medicine. The fabrication of such a cavity structure may be needed, for example, for the formation of micromechanical, micro-electromechanical (MEMS), micro-optical or micro-electronic devices. This means, the method for fabricating a cavity structure may be used in different kind of technical fields. The cavity structure may be manufactured using a sacrificial layer which is afterwards removed in an advanced stage of the production so that a hollow cavity structure is formed. The formation of such a cavity structure may be, for example, needed for the fabrication of a silicon microphone, wherein the cavity structure defines a hollow space between two membrane layers so that a deflectable membrane layer of the silicon microphone can be deflected in dependence of a detected acoustic wave. Such a silicon microphone may be formed as a condenser microphone.

SUMMARY OF THE INVENTION

Some embodiments relate to a method for fabricating a cavity structure using a carbon layer as a sacrificial layer, wherein the carbon layer is removed by means of dry etching so that a cavity structure is formed. Further embodiments relate to a method for fabricating a semiconductor structure which comprises a cavity structure, and wherein carbon is used as a sacrificial material in order to form the cavity structure. Further embodiments relate to a method for forming a cavity structure for a semiconductor device using a carbon layer which is deposited by chemical vapor deposition (CVD), and wherein the carbon layer is removed by dry etching so that a cavity structure between overlapping parts of a first and a second layer is formed. In further embodiments, a method for forming a cavity structure for a semiconductor microphone is described and a semiconductor microphone which is fabricated using the method.

DETAILED DESCRIPTION OF ILLUSTRATIVE EMBODIMENTS

Figure 1:
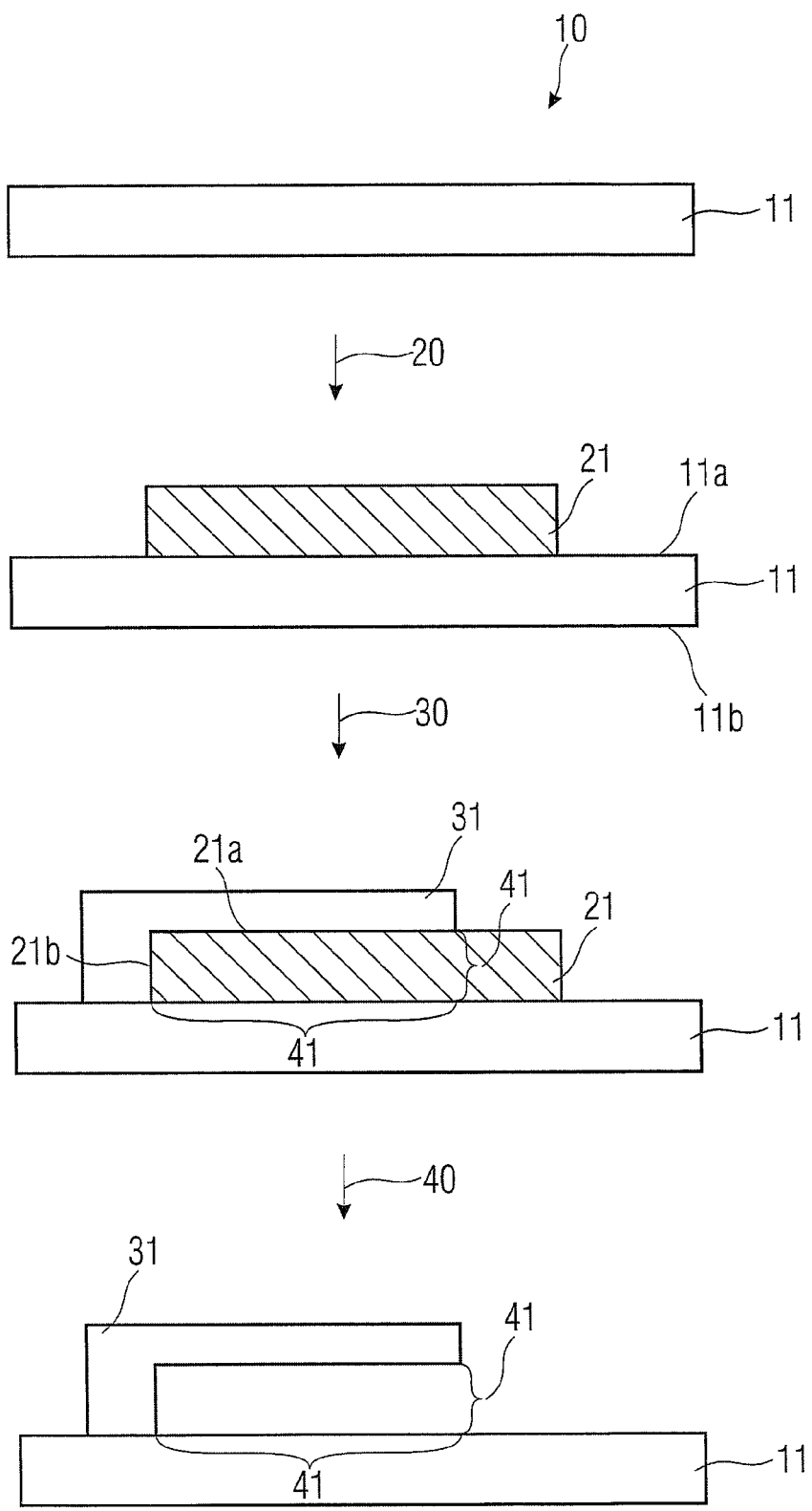
FIG. 1 shows a schematic side view of a cavity structure to describe a method for fabricating a cavity structure according to an embodiment.

In embodiments, a method for fabricating a cavity structure, for example, a cavity structure for a semiconductor structure or device is disclosed. In addition, embodiments for a method for fabricating a semiconductor structure, for example, a semiconductor microphone are described.

The fabrication of such a cavity structure may be used for the fabrication of micro-electromechanical structures (MEMS). Such a MEMS-structure can be, for example, a sensor or microphone which is able to detect a change of a pressure. The sensor or microphone may be configured as a pressure sensitive electrical capacitor. The pressure sensitive sensor can comprise two electrodes separated by a defined distance—an "air gap" with a defined thickness—which forms a dielectric medium. The air gap may be formed by a cavity structure whose fabrication is described herein. At least one of the two electrodes or membranes, are movable or deflectable. In dependence of the applied pressure, the thickness of the gap or the distance between the two electrodes is variable, and hence, the detectable capacitance values depend on the applied pressure.

Usually, for the fabrication of such a semiconductor structure, e.g. a silicon microphone, Tetra-Ethyl-Ortho-Silicate (TEOS) oxide is used to define the thickness of the gap or the cavity structure. The TEOS-oxide layer may act as a spacer and may be removed at a later stage of the fabrication process. The removal of the gap defining TEOS-oxide layer is usually performed by wet chemical etching, wherein the exchange of the fluid media, the etching medium and the reaction products between the gap region and the environment has to be performed through small openings in the electrodes. This necessary exchange of the fluid media is normally a critical step because of the requirement of defect free and residue-free removal of the TEOS-oxide layer in the gap or cavity structure region. Openings in the electrodes should be clean and residue-free and the membranes or electrode layers should be easily movable or deflectable without any sticking. After the removal of the TEOS oxide layer by means of wet chemical etching a subsequent wet chemical cleaning and drying step is performed. These cleaning and drying steps can be also critical because of a possible sticking of the two membrane layers. This is usually avoided by performing hydrophobic cleaning methods which result in clean surfaces and therewith free and easily movable membranes. But applying wet chemical etching to achieve a clean cavity structure requires additional expensive and time consuming process steps.

If a wet chemical etching is performed an unwanted underetching of the cavity structure and a contamination with impurities may arise. This means, applying a wet chemical etching in order to remove the auxiliary material, e.g. silicon oxide and to form the cavity structure has some disadvantages. For the wet chemical etching of silicon oxide hydrofluoric acid (HF) which is selective to silicon, may be used as etching medium. But nevertheless, a strong underetching at the side walls of the membrane and the creation of impurities remain as disadvantages. In addition, the time for performing the wet chemical etching is relatively long and the necessary equipment quite expensive. A further disadvantage is the usage of chemicals which are dangerous for the environment and human beings. To minimize the risk of an environmental pollution, expensive equipment has to be purchased and waste disposal measures have to be implemented.

A silicon oxide layer which may be deposited by CVD or which may be a thermal grown oxide can be used as material to define the gap between the two membrane layers. The removal of the silicon oxide layer can be performed by applying a gentle reaction of the latter $SiO_2$ layer, with a gaseous HF, e.g. HF-vapor.

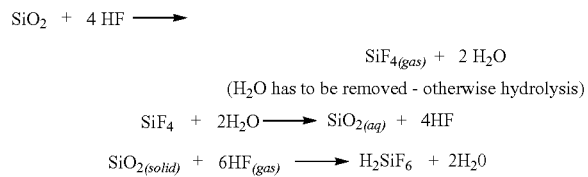

However, as can be seen in the formula, water ($H_2O$) is a reaction product which has to be removed from the cavity structure.

In embodiments for the fabrication of a cavity structure, movable membranes, for example, for a silicon microphone, can be embedded in other auxiliary or sacrificial materials. According to embodiments, carbon is used as auxiliary material or sacrificial layer which is then removed in a later stage of the fabrication process. The carbon layer may be deposited using a chemical vapor deposition (CVD) technique and can be easily and inexpensively removed, for example, by applying an oxygen plasma in a dry etching process. According to some embodiments, the removal of the carbon layer may be performed during the removal of the photo resist (lack stripping), so that a minimization of the process time can be achieved. This means, during the removal of the photo resist also the carbon layer can be removed by the applied oxygen plasma.

In further embodiments another etching medium instead of oxygen may be used for dry etching and removing the carbon layer. The respective etching medium for the dry etching should have a high selectivity to the membrane layer and also to a possible support structure or interfacial layer for the membrane layer. According to some embodiments the carbon layer may be removed by means of an isotropic dry etching process.

During fabrication the sacrificial carbon layer may be encapsulated so that it is not attacked or destroyed by a subsequent unwanted process step. This can be achieved by depositing a second membrane layer or an interfacial layer on top of the carbon layer in the shape of a lid. As a result, circumferential side walls of the carbon sacrificial layer may be also covered and protected against an unwanted influence during the fabrication process. The second membrane layer may have an opening or openings may be formed or etched in the second membrane layer, so that the sacrificial layer can be attacked and removed by a dry etching medium. The carbon layer can be removed residue-free in a gaseous phase solid state reaction. According to further embodiments, the carbon layer may be protected at the side wall by a silicon oxide. In this case, the second membrane layer may be flat or planar and may not comprise the above mentioned shape of a lid.

The carbon layer may, for example, be deposited by CVD. The deposited carbon layer may comprise a sufficient mechanical stability for depositing in a subsequent process the second membrane layer. The sacrificial carbon layer can be removed by a gentle reaction of the carbon layer with gaseous oxygen ($O_2$), for example, by a thermal oxidation or plasma oxidation. Thereby, the following chemical reaction may take place:

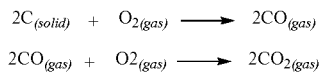

The reaction products, CO and $CO_2$ can easily be removed since they are also gaseous. Therewith, the sticking problem may be avoided, which may arise from the usually applied wet chemical etching and the subsequent cleaning and drying steps.

According to embodiments, a sacrificial layer made of carbon can be removed by applying one or a sequence of gently gaseous phase solid state reaction instead of using process critical wet chemical etching and cleaning processes. Therefore, a critical fluid medium exchange, i.e. an exchange of an etching medium and etching reaction products, through openings of a membrane layer can be avoided. Furthermore, no wetting weaknesses of the materials forming the gap or cavity structure may occur. A removal of the sacrificial layer by means of a gaseous phase solid state reaction allows a good exchange of the gaseous etch medium and the gaseous reaction products through openings in the membrane.

No critical drying step after the etching of the gap or cavity structure is necessary, since dry etching is performed. The exchange of the gases can be performed directly in the gas phase reaction chamber without mechanically moving the wafer or the substrate. The described method for fabricating a cavity structure can result in a reduced defect density, since a reduced mechanical movement and handling of the wafer and etching medium is necessary compared to a method using wet chemical etching. In contrast, if a wet chemical etching is performed a wafer or substrate has to be carried between the etch cell to a rinsing station and further on to a drying station, so that the wafer or substrate has to be transported frequently which may result in damage and therefore in a higher defect density.

By dry etching the pure carbon can be chemically converted to carbon monoxide (CO), respectively to carbon dioxide ($CO_2$) wherein both gases are dry gases that can be removed residue-free. Therewith, a sticking, a contamination with left impurities and an environment pollution can be avoided. Furthermore, the described method for fabricating a cavity structure, e.g. for a semiconductor structure can be performed using a batch process so that a plurality of wafers or substrates can be processed at the same time. In contrast, the wet etching process may be performed in a single wafer process, so that the process time is significantly longer and the production more expensive.

The usage of carbon as a sacrificial layer for forming gaps or cavity structures may comprise a couple of advantages. Compared to the usual method for forming a cavity structure using a sacrificial oxide layer—, for example, a TEOS layer,—the process costs can be reduced. The carbon layer can be removed residue-free by dry etching, since no or almost no particles or residuals of the gaseous etching medium remain in the cavity structure, since the carbon layer can be completely dissolved in the gaseous reaction products.

According to another aspect, no special and expensive equipment has to be used to perform the method as described in the embodiments herein. No additional mask step for evaluation and therefore no additional costs may be necessary. The non-uniformity of the carbon deposition is less than 10%. To protect the deposited carbon layer, it may be encapsulated with a nitride and/or oxide interfacial layer or by means of the second membrane layer. In addition, a wet resist strip after structuring of the carbon can be performed.

In the following, embodiments will be described in more detail by means of a plurality of FIGS. 1 to 4b.

As it is schematically depicted in FIG. 1, according to embodiments, the method for fabricating a cavity structure may be performed by providing 10a first layer 11, depositing 20a carbon layer 21 on the first layer 11, covering 30 at least partially the carbon layer 21 with a second layer 31 to define the cavity structure 41 and removing 40 by a means of dry etching the carbon layer 21 between the first 11 and second layer 31 so that the cavity structure 41 is formed.

The first layer 11 may be, for example, a semiconductor substrate, an insulating layer, a conductive layer, a metal layer, a layer made of an inorganic or organic material. The first layer may be a layer made of glass, ceramic, plastic or other synthetic material. In some embodiments at least one of the first and second layer 31 may comprise polysilicon. The polysilicon may comprise p- or n- type dopants. The first layer 11 may be a semiconductor wafer. According to some embodiments, the first layer may comprise a thickness between about 1 nm to about 1 cm, between about 10 nm and about 100 µm or between about 10 nm and about 10 µm. The first layer may be configured as a membrane layer.

As it is shown in FIG. 1, a carbon layer 21 may be deposited on the first layer 11. The deposition may take place on a first main surface 11a of the first layer which is opposite to a second main surface 11b of the first layer 11. The carbon layer 21 may be in direct contact to the first layer 11. According to some other embodiments, at least one interfacial layer may be arranged between the carbon layer 21 and the first layer 11.

According to some embodiments, the carbon layer 21 may be deposited using chemical vapor deposition (CVD). The carbon layer 21 may be deposited using a low pressure chemical vapor deposition (LPCVD) method. According to some embodiments, the deposition of the carbon layer may be performed in a temperature range between about 600° C. to about 1000° C., between about 700° C. and about 900° C., or between about 750° C. to about 850° C. The deposition of the carbon layer may be, for example, performed at a pressure between about 1 Torr to about 700 Torr, about 1 Torr to about 500 Torr, or between about 90 Torr to about 110 Torr, e.g. about 100 Torr. The carbon may be deposited in a batch process, e.g. in a batch oven process. This means that the deposition of the carbon layer can be performed for a plurality of cavity structures at the same time. For the deposition of the carbon layer, a precursor can be used, for example, Ethane or Acetylene. In general, there may be a plurality of gases which comprise and which may be used as a precursor for the deposition of the carbon layer. In some embodiments the temperature for the deposition of carbon may be between about 700° C. and about 900° C. In case Ethane is used as a precursor, the carbon deposition temperature may be between about 830° C. and about 870° C. It may be, for example, about 850° C. In case Acetylene is used as precursor, the carbon deposition temperature may be between about 730° C. and about 770° C. It may be, for example, about 750° C.

According to some embodiments, the carbon precursor gas may be diluted with nitrogen gas ($N_2$) during the deposition of carbon. The overall gas flow during the deposition of the carbon layer by CVD may be between about 0.5 slm to about 8 slm, or for example, between about 1 slm to about 5 slm. The carbon precursor share may be in a range of about 10% to about 90% or about 20% to about 80% of the overall gas flow. According to some embodiments, a total pressure or pressure may be in a range of about 1 Torr to about 500 Torr, for example, about 100 Torr, during the deposition of the carbon layer.

The deposition of the carbon layer may be performed so that the carbon layer comprises a graphite structure in a share of about 20% to about 90% of the carbon layer. The carbon deposition can be performed so that the non-uniformity of the deposited carbon layer is lower than about 10%. This means the carbon layer can be deposited with a high uniformity.

As it is schematically shown in FIG. 1, the carbon layer 21 may be covered in a subsequent covering process 30 at least partially with a second layer 31. The cavity structure 41 may be defined by covering or depositing the second layer on the carbon layer. According to some embodiments, the cavity structure 41 is defined by an overlapping part of the second layer 31, the carbon layer and the first layer 11. This means, according to some embodiments the cavity structure may be just defined by the overlapping part of the first and second layer. A side wall which may encapsulate the cavity structure is not needed to define the cavity structure. According to other embodiments the cavity structure is defined by the overlapping part of the first and second layers and by at least one side wall. According to some embodiments, the carbon layer may be completely covered by the second layer. This means, also the side walls of the carbon layer 21 may be completely or at least partially covered with a second layer. Covering 30 the carbon layer with the second layer 31 may be performed so that a main surface 21a of the carbon layer and a side wall 21b of the carbon layer is covered at least partially by the second layer 31.

The second layer 31 may be made of a semiconductor material, an insulating material, or a conductive material. The second layer 31 may be configured as a membrane layer. The second layer may be a metallic layer or a semiconducting layer, for example, made of polysilicon which can be doped with n- or p- type dopants. The second layer may be an oxide or nitride layer. It may comprise titanium, wolfram, aluminum, copper, silicon, silicon oxide, gallium arsenide, indium phosphide, organic-, polymeric materials or other materials which may be used, for example, in the semiconductor process technology.

As it is schematically depicted in FIG. 1, the cavity structure is formed by removing 40 the carbon layer between the first and second layers by a means of dry etching. The carbon layer can be removed by means of dry etching using oxygen ($O_2$), for example, during thermal oxidation or plasma oxidation. The sacrificial carbon layer can be removed by means of different dry etching methods, so that no wet etching process is necessary in order to form the cavity structure 41. Dry etching methods may involve, for example, deep reactive ion etching (DRIE) methods, reactive sputtering, Bosch etching methods, reactive ion beam etching techniques, barrel etching techniques, sputter etching technique or ion beam etching techniques. The carbon layer 21 may be removed using plasma or a barrel dry etching technique. The dry etching process may be performed as a batch process so that, for example, a plurality of wafer can be etched at the same time. As a consequence, a high throughput of wafers can be achieved.

The dry etching process is performed using an etching medium with a high etch selectivity with respect to the carbon layer and the surrounding first-, second-, or interfacial layers, so that only or mainly the carbon layer is removed and the surrounding layers are not, or only marginally attacked by the dry etching medium. By means of the dry etching, a complete removal of the sacrificial carbon layer in the cavity structure between the first and the second layers can be achieved, so that the cavity structure or under etching is achieved. According to some embodiments the dry etching may be performed as an isotropic etching process. The carbon layer 21 may be reduced to ashes by the dry etching process so that a clean and smooth cavity structure without residuals of carbon can be formed. This means, the dry etching process of the sacrificial carbon layer, e.g. by an oxygen plasma, permits in a simple manner the fabrication of a clean and residue-free cavity structure.

According to embodiments for fabricating a cavity structure, carbon can be used as sacrificial layer, wherein the carbon layer is arranged between a first and a second layer whose overlapping area defines the cavity structure. The sacrificial carbon layer may be removed by means of dry etching, so that a clean and residue-free cavity structure is formed. Such a cavity structure may be used, e.g. in different types of micro-sensors, micro-mechanical devices, micro-electromechanical devices or micro-optical devices.

Figure 2A:
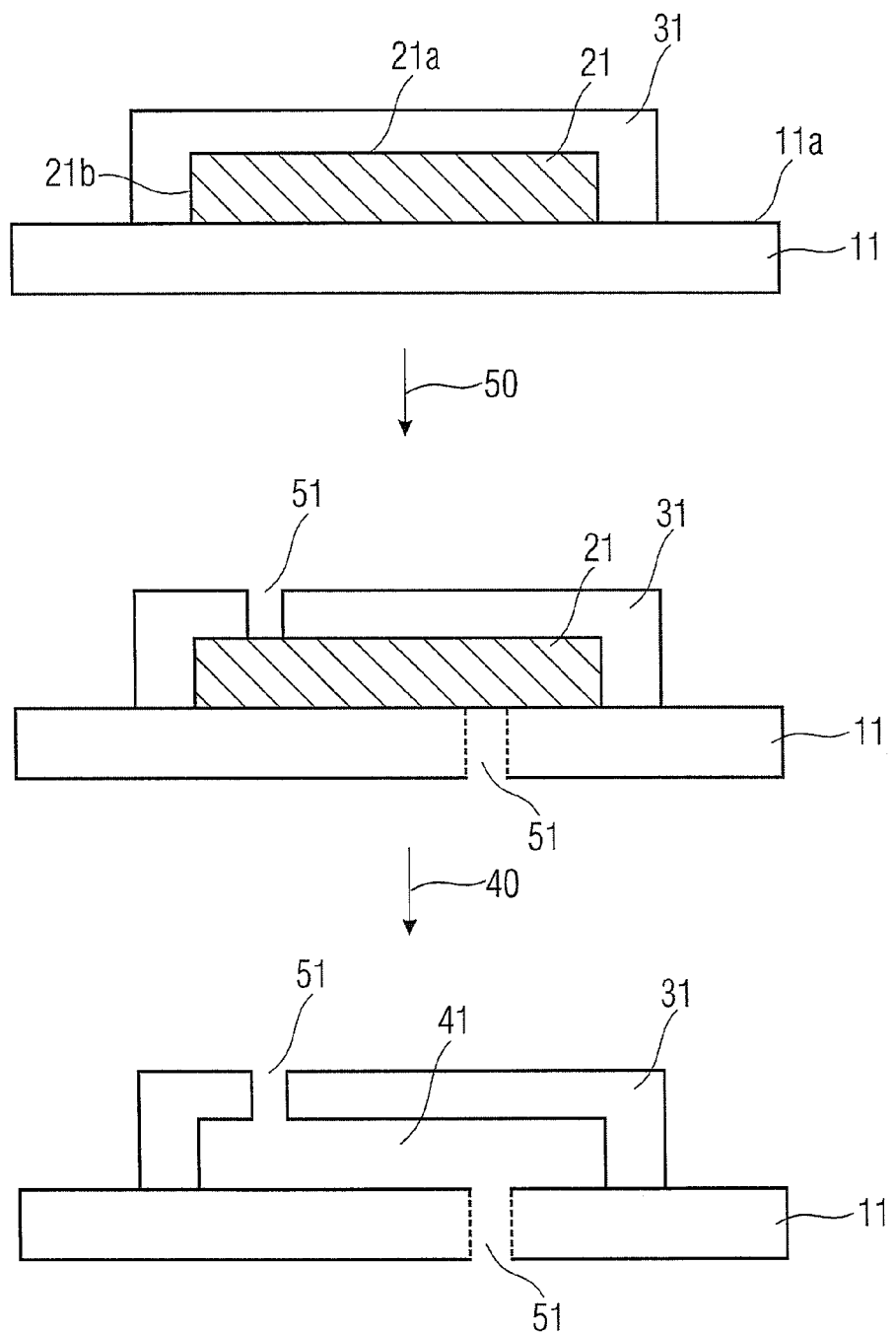
FIG. 2a shows a schematic side view of a cavity structure to describe the fabrication of a cavity structure using an opening in a first or second layer.

In FIG. 2a, a schematic side view of an interstage cavity structure is depicted. On top of a first main surface 11a of a first layer 11, a carbon layer 21 is deposited as described above. Afterwards the carbon layer 21 is completely covered by the second layer 31. This means, that the main surface 21a, as well as the side walls 21b of the carbon layer 21 are covered by the second layer 31. The carbon layer may be completely encapsulated by the second layer 31 and the first layer 11. According to some embodiments, the method for fabricating a cavity structure may further comprise the formation 50 of at least an opening 51, in at least one of the first 11 or second layer 31. The opening 51 may used to allow an exchange of the etching medium and the reaction products during the subsequent dry etching 40 of the carbon layer 21. This means, according to some embodiments at least one opening 51 is formed in the second layer and/or in the first layer 11 (shown as dashed line), so that a dry etching medium can attack the encapsulated carbon layer 21 during the removal 40 of the carbon. It should be noted that the first layer may already comprise an opening 51 when it is provided 10 to deposit the carbon layer on a main surface 11a of the first layer 11. According to other embodiments, an opening 51 in the first layer or second layer may be formed in a separate step 50. An opening 51 in the second layer can be generated during the process of covering 30 the carbon layer 21 with the second layer 31, or it may be formed in a subsequent step 50. The opening 51 may be suitable for a dry etching medium to attack and remove the sacrificial carbon layer 21.

Figure 2B:
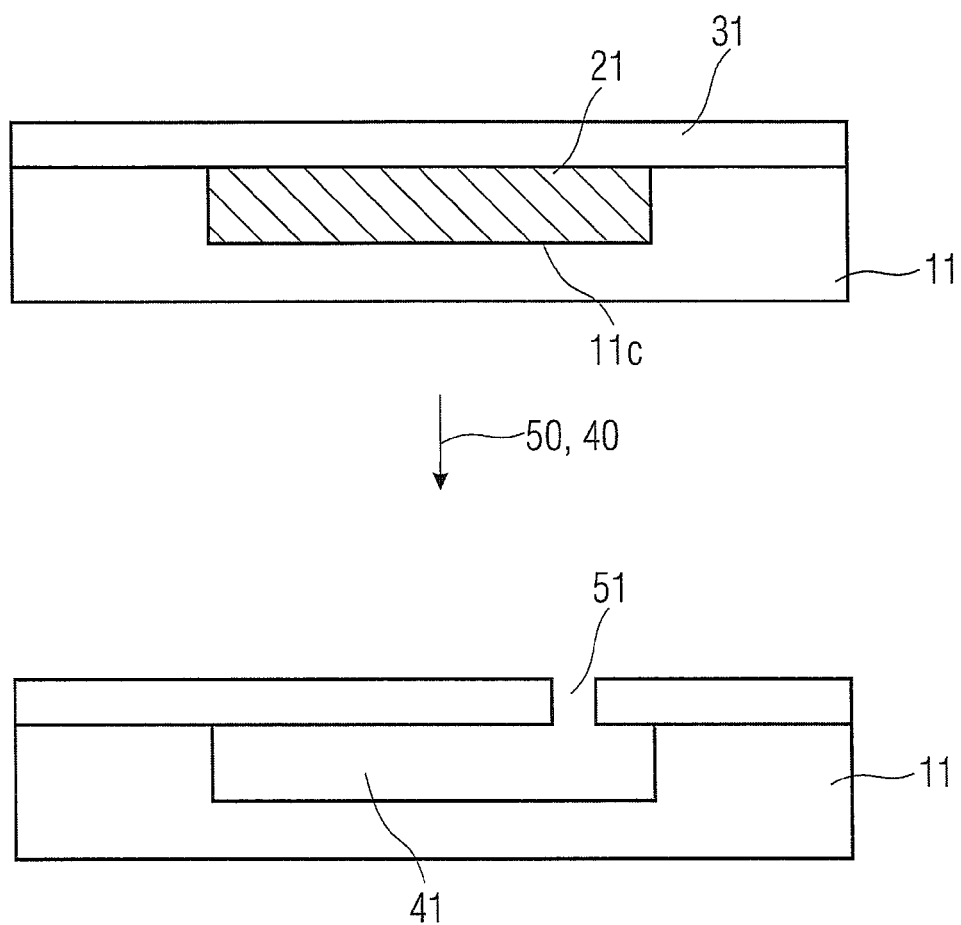
FIG. 2b shows a schematic side view of a cavity structure comprising a recess in a first layer and using an opening to remove a sacrificial carbon layer so that the cavity structure is formed.
Figure 2C:
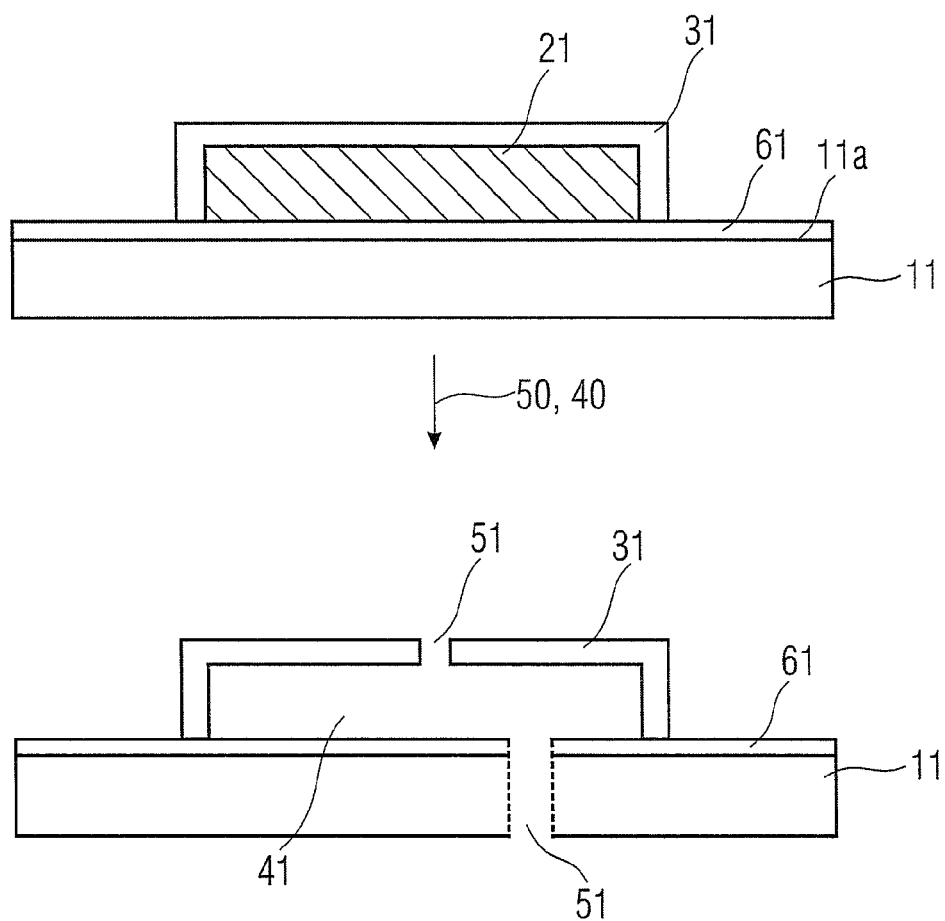
FIG. 2c shows a schematic side view of a cavity structure comprising an interfacial layer between the cavity structure and a first layer.

As it is schematically shown in FIG. 2b, the first layer 11 may comprise a recess or trench structure 11c. This means, providing 10a first layer 11 may be performed so that the first layer 11 comprises a recess or trench 11c. The deposition 20 of a carbon layer 21 is performed so that the recess or trench structure 11c is filled with the sacrificial carbon layer 21. According to this embodiment the coverage 30 of the carbon layer may be performed so that the carbon layer 21 and the recess 11c is at least partially covered with the second layer 31. In FIG. 2b, the carbon layer 21 is completely covered with the second layer 31. In this case, at least one opening 51 may be formed 50 in the second layer 31, so that by means of dry etching the carbon layer 21 can be removed 40 and the cavity structure 41 built.

According to another embodiment (see FIG. 2c), a first layer 11 may be provided and on top of the first main surface 11a of the first layer 11 an interfacial 61 may be deposited. Afterwards, a carbon layer 21 may be deposited 20 on top of this first layer and the interfacial layer 61, as described above. This means, between the carbon layer 21 and the first layer 11 at least one interfacial layer 61—the first layer interfacial layer—is arranged. Then, the carbon layer 21 is covered, at least partially, as described above with the second layer 31. According to this embodiment, the second layer 31 and the first layer 11 are not in direct contact to each other. Both are separated by the interfacial layer 61. The first layer interfacial layer 61 may be, for example, an insulating layer and the first and second layers 11 and 31 may be semiconducting or conductive layers which are electrically insulated against each other by the interfacial layer 61. The first layer and the interfacial layer between the carbon layer and the first layer may physically separate the first and the second layers from each other. At least an opening in the second layer 31 and/or an opening in the first layer 11 and the interfacial layer 61 may be formed so that in a subsequent dry etching process the sacrificial carbon layer 21 can be removed. According to some embodiments, the first layer interfacial layer 61 may, for example, be an insulating layer made of nitride or oxide. In further embodiments the first layer interfacial layer 61 may comprise two or more different layers.

Figure 2D:
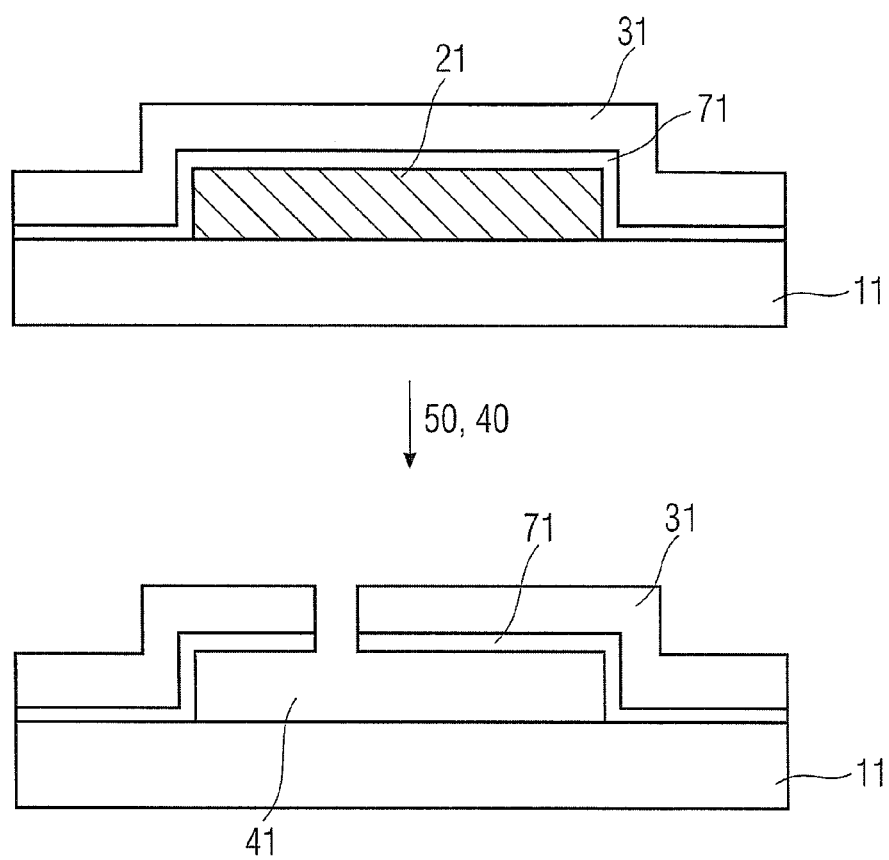
FIG. 2d shows a schematic side view of a cavity structure using an interfacial layer between the sacrificial carbon layer and a second layer.

As it is schematically shown in FIG. 2d, according to other embodiments, the carbon layer 21 may be covered by a second layer interfacial layer 71. The second layer interfacial layer 71 may prevent a direct contact of the second layer 31 and the carbon layer 21. The second layer interfacial layer 71 may be made of nitride or oxide. According to other embodiments, the second layer interfacial layer 71 may comprise a plurality of different layers arranged between the second layer 31 and the carbon layer 21. The second layer interfacial layer 71 may comprise a nitride/oxide layer which may mechanically support and stabilize the second layer 31. The second layer 31 may be formed as a membrane layer.

At least one opening 51 may be formed in the second layer 31 and the second layer interfacial layer 71 so that a dry etching medium can attack the carbon layer 21 and to remove the encapsulated carbon layer 21, so that the cavity structure 41 is formed. According to other embodiments, a cavity structure 41 may comprise a first layer interfacial layer 61, as described in the context of FIG. 2c, and a second layer interfacial layer 71, as described in context of FIG. 2d.

Figure 2E:
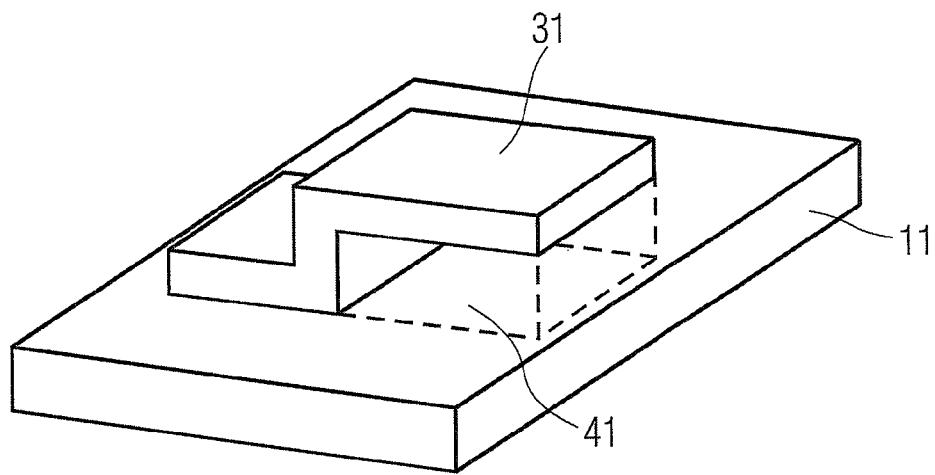
FIG. 2e shows a schematic drawing of a cavity structure built by an overlapping region of a first layer and a second layer after removing an intermediate sacrificial carbon layer.

In FIG. 2e, a schematic perspective view of a cavity structure fabricated with the inventive method is depicted. The cavity structure 41 which is defined by an overlapping part of the second layer 31 with a first layer 11 is schematically depicted by the dashed line. According to embodiments, a cavity structure 41 may comprise at least one side wall. In further embodiments, a cavity structure 41 may be defined by an overlapping, under etched region of the first layer and the second layer.

Figure 2F:
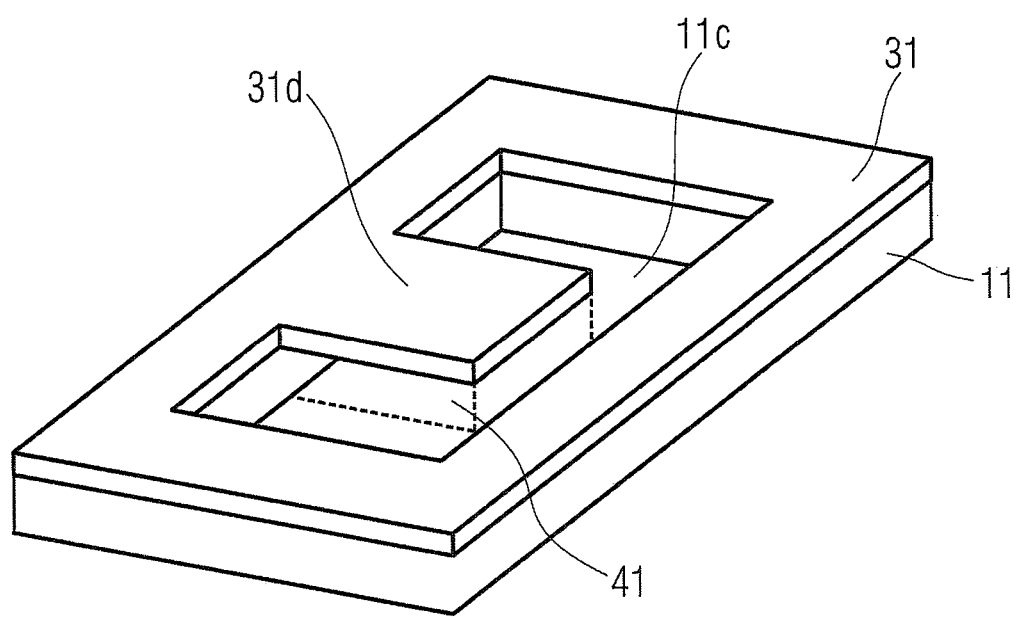
FIG. 2f shows a schematic drawing of a cavity structure formed in a recess structure wherein the cavity structure is defined by an overlapping region of a first and a second layer.

In FIG. 2f, a perspective view of another cavity structure 41 is depicted. In this embodiment, a carbon layer has been deposited in a recess structure 11c of the first layer 11, as described in context of FIG. 2b. After depositing 20 the carbon layer in the recess structure 11c, the carbon layer is covered 30, at least partially, with the second layer 31. After removing 40 the carbon layer by a means of dry etching, the cavity structure 41 with the freestanding cantilever structure 31d is formed. In this embodiment, the cavity structure 41 is defined by the overlapping parts of the second layer 31, the removed carbon layer and the first layer 11.

Figure 2G:
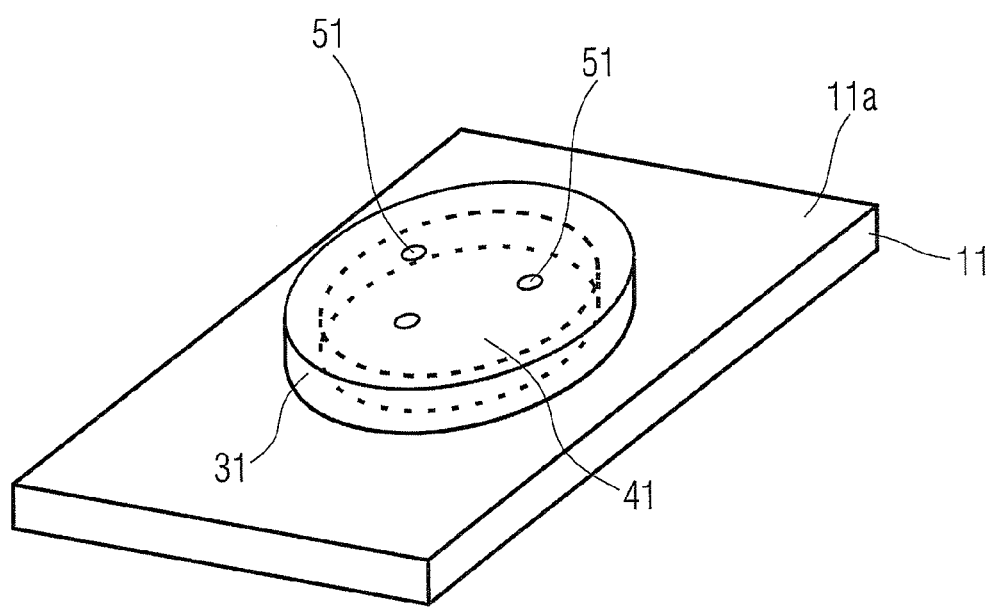
FIG. 2g shows a schematic drawing of a round cavity structure defined by an overlapping region of a first and a second layer.

In FIG. 2g, a schematic perspective view of a round cavity structure 41 is depicted. In this embodiment, the carbon layer has been deposited 20 in a round shape on top of a main surface 11a of a first layer 11. Afterwards, the carbon layer has been completely covered with a round-shaped second layer 31 so that a kind of disc or lid is formed. The lid covers the main surface of the carbon layer 21, as well as, the circumferential side wall of the carbon layer. The second layer 31 may comprise at least one opening 51 which may be formed during the deposition of the second layer or in a separate step so that an etching medium can attack the encapsulated carbon layer. The encapsulated carbon layer is completely removed so that a round disc-like cavity structure 41 is formed which is defined by the overlapping part of the second layer, the removed carbon layer and the first layer. It should be mentioned that different types of cavity structures with different geometry, size and shape can be formed by means of the inventive methods.

According to some embodiments, the fabrication of the semiconductor structure may comprise the step of providing 10 an interstage semiconductor structure comprising a semiconductor material and a sacrificial material made of carbon. The sacrificial material is removed from the interstage semiconductor structure in order to form the semiconductor structure. The removal 40 of the sacrificial layer may be performed by means of dry etching, for example, by plasma etching or a reactive ion etching. Embodiments describe a method for forming a cavity structure for a semiconductor device wherein the method comprises applying a chemical vapor deposition technique to deposit a carbon layer on a first layer, wherein the chemical vapor deposition is performed at a temperature between about 700° C. and about 900° C., and at a total pressure or pressure between about 1 Torr and about 500 Torr. The method further comprises to cover, at least partially, a carbon layer with a second layer, so that a cavity structure is defined by an overlapping part of the second layer covering the carbon layer and the first layer. Then, the cavity structure is formed by removing the carbon layer, at least in the overlapping part, by an etching medium etching.

In the following, an embodiment for a method for forming a cavity structure for a semiconductor microphone is described. Such a semiconductor microphone may be realized as condenser microphone comprising two membrane layers which form a capacitor and which are separated by the cavity structure. Depending on an incoming sound wave at least one of the two membrane layers may be deflected or moved in the direction of the other membrane layer, so that the capacity of the capacitor changes. Therewith, the sound wave can be transformed in an electrical signal.

Figure 3A:
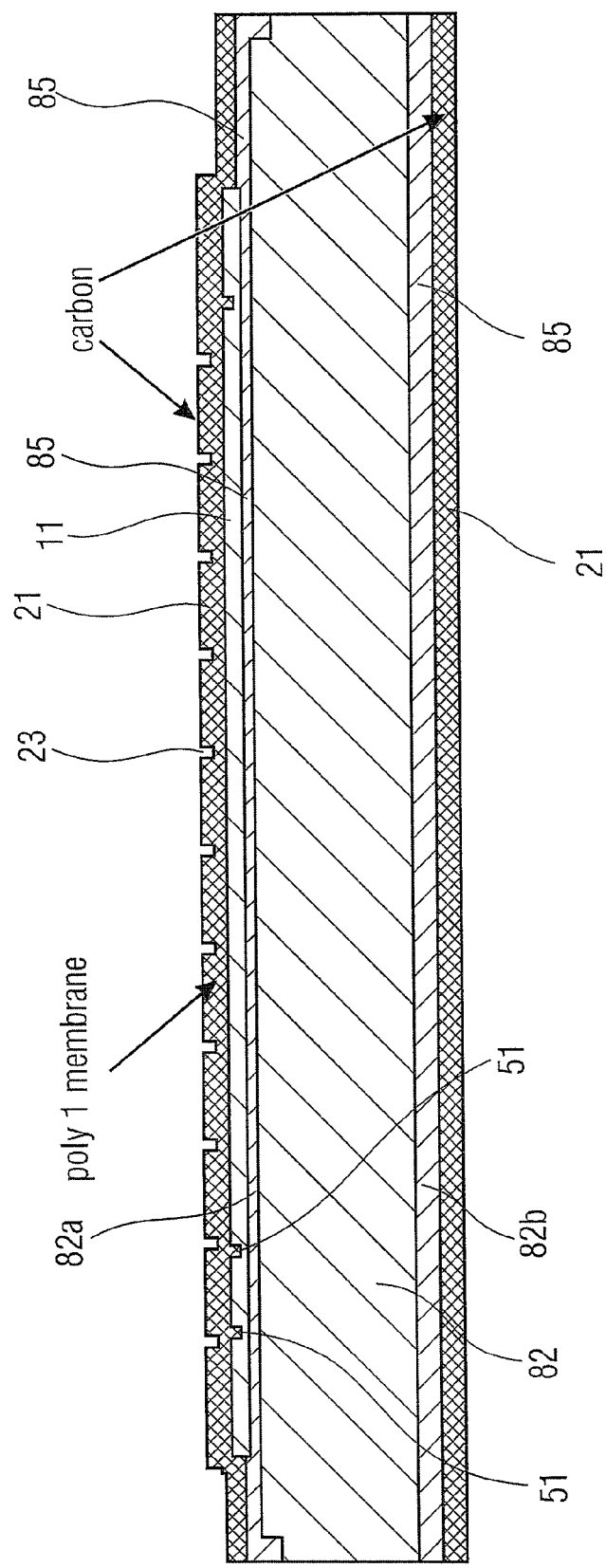
FIG. 3a shows a schematic side view of semiconductor microphone structure to describe the formation of a cavity structure for the semiconductor microphone, wherein carbon is used as a sacrificial layer.

FIG. 3a shows a schematic side view of an interstage semiconductor structure for a semiconductor microphone. The interstage semiconductor structure 81 may comprise a semiconductor substrate 82, wherein on a top of a first 82a and a second 82b main surface an insulating layer 85 is arranged. The semiconductor substrate 82 may be, for example, a silicon substrate, and the insulating layer 85 may be a silicon oxide layer. A conductive first membrane layer 11 is deposited on the first main surface 82a of the semiconductor substrate 82. The conductive first membrane layer 11 may be the first layer, as described in context of the above mentioned FIGS. 1 to 2g, wherein the conductive first membrane layer 11 is made of polysilicon, for example. By means of chemical vapor deposition, a carbon layer 21 is deposited 20, as described herein, on the first membrane layer 11. The first membrane layer may be fabricated as poly1 in a semiconductor process. The chemical vapor deposition may be performed at a temperature between about 700° C. and about 900° C., and at a pressure between about 1 Torr to about 500 Torr. In this embodiment the carbon layer may also cover the oxide layer 85 at the second main surface 82b of the substrate 82. According to some embodiments deepenings 23 for a subsequent formation of bumps may be etched in the deposited carbon layer 21.

Figure 3B:
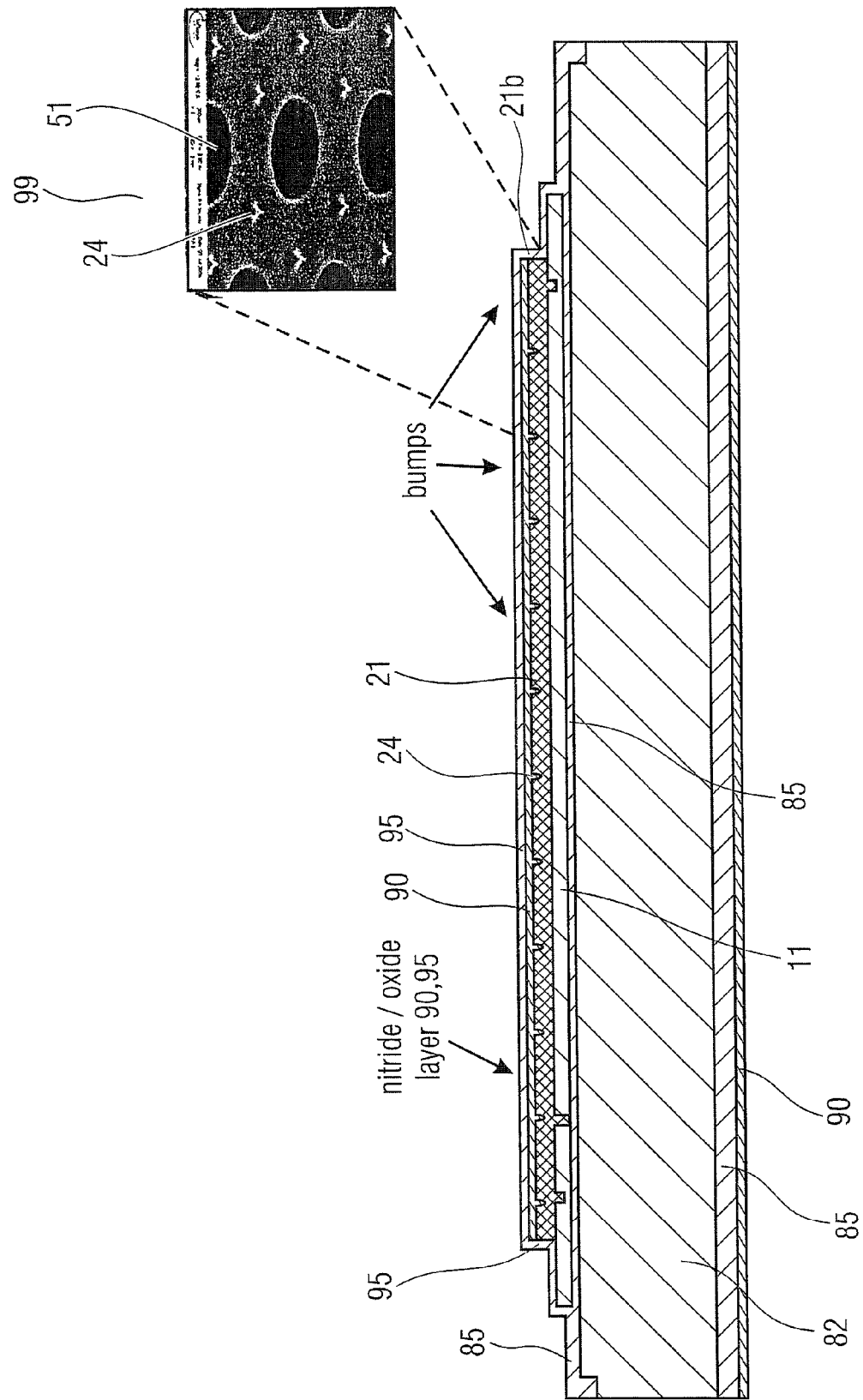
FIG. 3b shows a schematic side view of semiconductor microphone structure to describe the formation of the cavity structure, wherein the sacrificial carbon layer is covered by a nitride layer and encapsulated by an oxide layer.

In FIG. 3b on top of the carbon layer 21, a nitride 90 layer is deposited. Therewith, the deepenings 23 are filled with nitride 90 so that the bumps 24 are built. Outside of the membrane region and the on the backside of the semiconductor substrate 81b the carbon may be removed. Afterwards, the carbon layer between the nitride layer 90 and the first membrane layer 11 may be encapsulated by an oxide layer 95. The oxide layer 95 may cover the side walls 21b of the carbon layer 21. The oxide layer 95 may encapsulate the carbon layer so that the carbon layer is protected in subsequent process steps against an unwanted attack of the carbon layer. In order to form the cavity structure for the silicon microphone, a conductive second membrane layer 31 which may comprise a couple of openings 51, may be deposited on top of the carbon layer. The second membrane layer 31 may comprise, e.g. polysilicon, which is n- or p- type doped. In the enlargement 99 the openings 51 and the bumps 24 are shown more detailed.

Figure 3C:
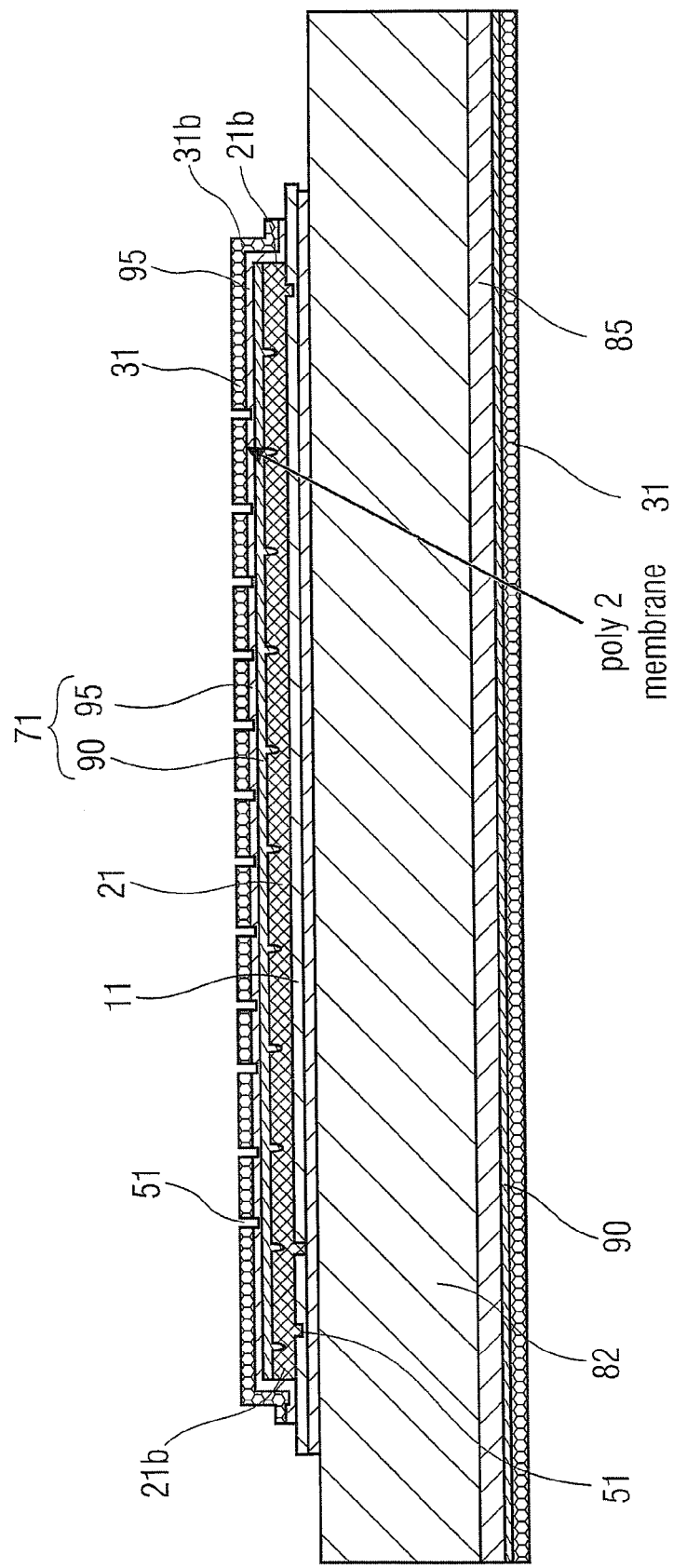
FIG. 3c shows a schematic side view of depositing a second membrane layer as a lid on top of a carbon layer covered with the nitride oxide layers.

As it is schematically shown in FIG. 3c, the second membrane layer 31 may cover a main surface 21a of the carbon layer, as well as, at least partially the circumferential side wall 21b of the carbon layer. Therefore, the second membrane layer 31 comprises the shape of a lid which is put on the carbon layer. The lid made of the membrane layer 31 may serve as a protection against unwanted subsequent process steps which might attack the carbon layer. Then openings 51 are etched in the second membrane layer 31.

Figure 3D:
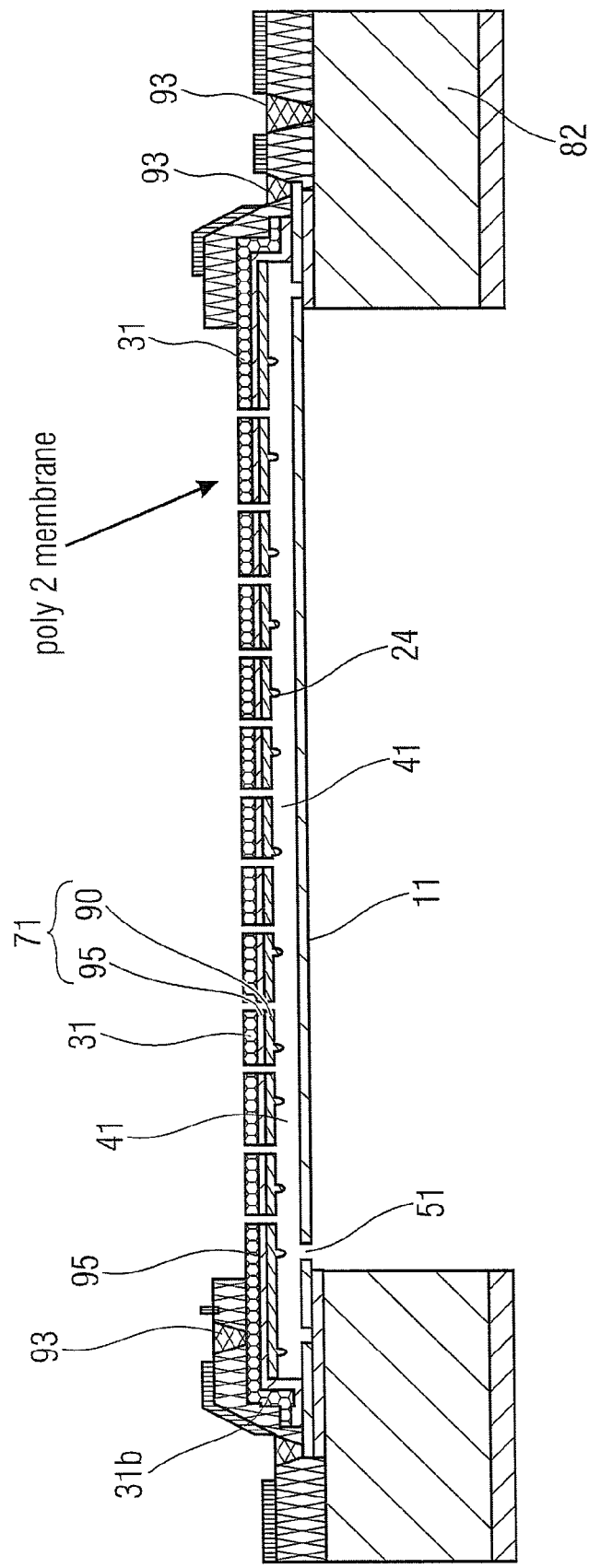
FIG. 3d shows a schematic silicon microphone after removing the carbon layer so that a cavity structure between the first and second membrane layers is formed.

In FIG. 3d, openings 51 are also etched in the nitride and oxide layers 90, 95 which form the above described second layer interfacial layer 71. The etching of the interfacial layer 71 may be performed by means of a reactive Bosch etching process. Afterwards, the carbon layer 21 can be removed 40 by means of dry etching, wherein the dry etching medium attacks the carbon layer through the openings 51 in the second membrane layer. After removal of the carbon layer, the cavity structure between the first 11 and second 31 membrane layers is formed. The second membrane layer 31 is mechanically reinforced by the nitride, oxide layers 90, 95. In order to manufacture a functional silicon microphone further process steps may be necessary. For example, a backside etching from the second main surface 82*b* of the substrate 82, down to the first membrane layer 11 may be performed and furthermore, electrical connections and terminals to the conductive first and second membrane layers may be formed.

FIG. 3*d* depicts the schematic side view of a semiconductor microphone, which comprises a conductive first membrane layer 11, separated by a cavity structure 41 from a conductive second membrane layer 31, wherein the second membrane layer 31 comprises a circumferential side wall 31*b* which is extending in the direction to the first membrane layer 11, so that the cavity structure 41 is defined by the first membrane layer 11 and the second conductive membrane 31 with the circumferential side wall 31*b*. The second membrane layer 31 with the circumferential side wall 31*b* may be formed so that during the fabrication of the semiconductor microphone, the sacrificial layer 21 is encapsulated and protected at the side walls 21*b*. The same can be accomplished by the oxide layer 95 which can in addition or alternatively cover the side walls 21*b* of the carbon layer 21. This means, the carbon layer 21 is protected against an unwanted attack of the carbon layer during the application of further process steps until the carbon layer is removed by dry etching. The second membrane layer 31 may have the shape of a cover lid or lid. The second membrane layer 31, as well as the first membrane layer 11 may comprise openings 51.

Figure 4A:
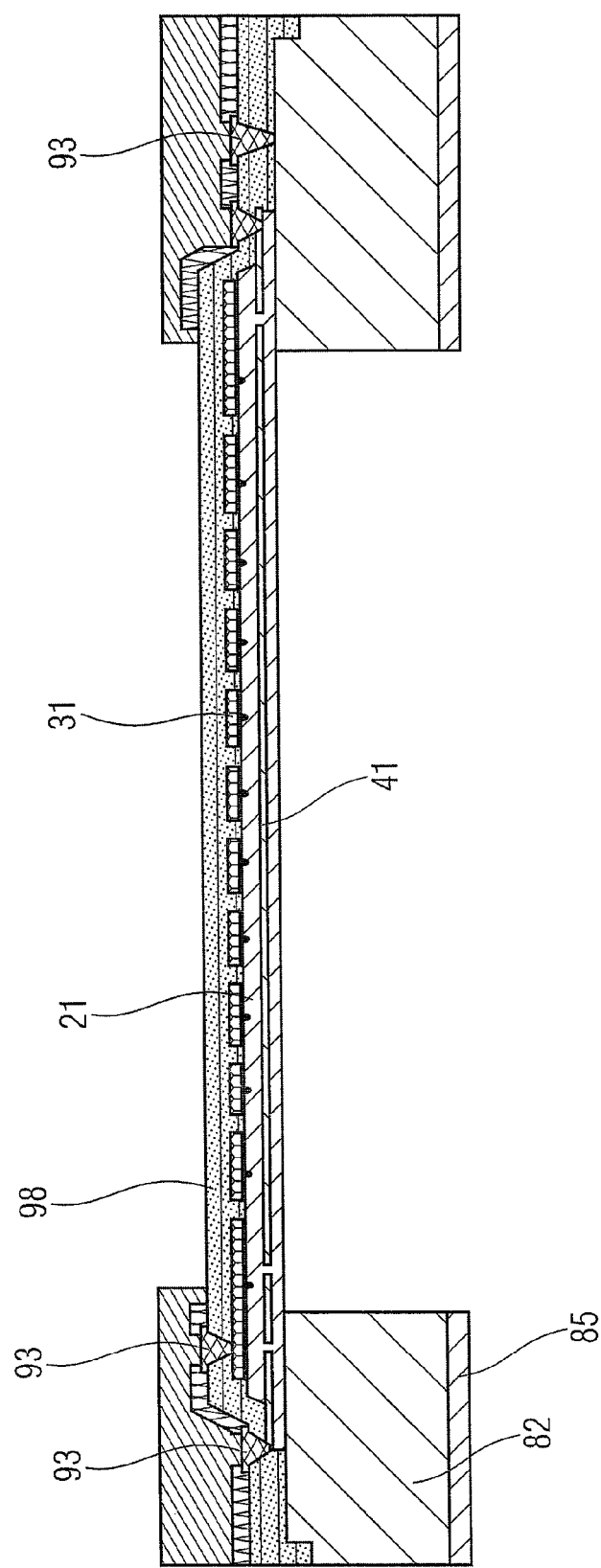
FIG. 4a shows a side view of a silicon microphone comprising a carbon sacrificial layer between a first and second membrane layer according to another embodiment.

FIG. 4*a* shows a schematic drawing of a pressure sensitive MEMS, for example, a (DSOUND) silicon microphone before the gap defining carbon layer 21 is removed. The etch construction 98 serves for mechanical stabilization of the electrodes 11 and 31. The second electrode 31 may be moveable or deflectable, if the cavity structure defining carbon layer 21 is removed.

Figure 4B:
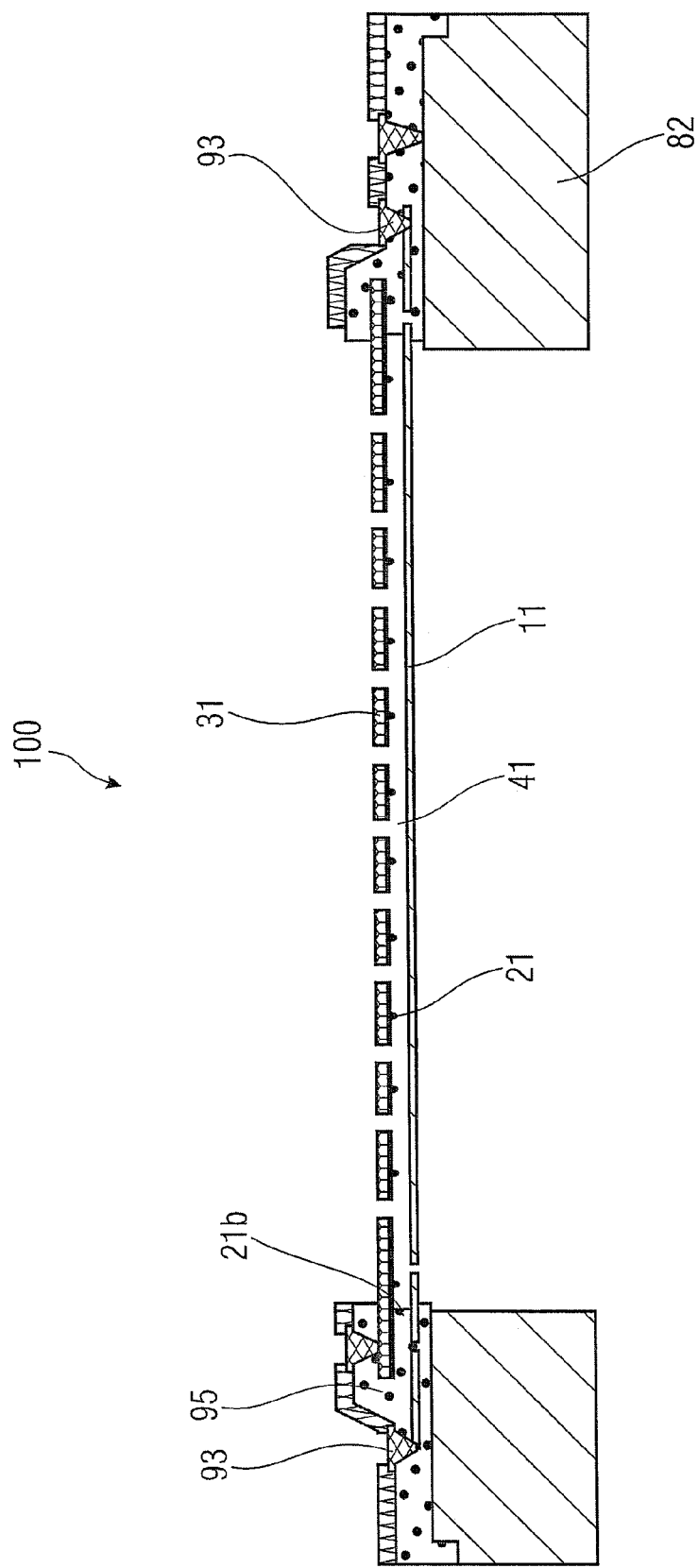
FIG. 4b shows a schematic side view of a silicon microphone comprising a cavity structure between a first and a second membrane layer after removing the carbon sacrificial layer.

As it is shown in FIG. 4*b*, a semiconductor microphone may comprise a flat or plane second membrane layer 31 without the circumferential side wall 31*b*, as described in context of FIG. 3*d*. A sacrificial layer made of carbon 21 is arranged between the first and second membrane layer. The side walls 21*b* of the carbon layer may be protected by an oxide layer 95. After the removal of the sacrificial layer the semiconductor microphone is formed. The silicon microphone 100 may be a condenser microphone with a first 11 and a second 31 conductive membrane layer which are electrically isolated from each other, and wherein each membrane layer comprises their own electrical connections and terminals 93.

In some embodiments the second layer 31 may comprise, for example, a thickness between about 10 nm and about 10 µm or between about 10 nm and about 100 nm. The thickness of the deposited carbon layer 21 may be, for example, between about 100 nm and about 10 µm or between about 1 µm and about 4 µm and the thickness of the first layer 11 may be, for example, between about 10 nm and about 10 µm or between about 10 nm and about 100 nm.

It should be noted, that while this invention has been described in terms of several embodiments, there are alterations, permutations, and equivalents which fall in the scope of this invention. It should also be noted that there are many alternative ways of implementing the methods and compositions of the present invention. It is therefore intended, that the following appended claims be interpreted as including all such alterations, permutations and equivalents as fall within the true spirit and scope of the present invention.

What is claimed is:

1. A method for fabricating a cavity structure, the method comprising:
   providing a first layer;
   depositing a carbon layer on the first layer, wherein the deposition of the carbon layer is performed at a temperature between 700° C. to 900° C.;
   covering at least partially the carbon layer with a second layer to define the cavity structure; and
   using dry etching, removing the carbon layer between the first and second layers so that the cavity structure is formed.

2. The method according to claim 1, wherein the covering is performed so that a main surface of the carbon layer and a side wall of the carbon layer are covered by the second layer.

3. The method according to claim 1, further comprising forming an opening in at least one of the first or second layers for performing a dry etching of the carbon layer.

4. The method according to claim 1, wherein the deposition of the carbon layer is performed at a temperature between 750° C. to 850° C.

5. The method according to claim 1, wherein the deposition of the carbon layer is performed at a pressure between 1 Torr to 500 Torr.

6. The method according to claim 1, wherein the deposition of the carbon layer is performed using a carbon precursor gas diluted with nitrogen, wherein an overall gas flow is between 1 slm and 5 slm, and wherein the carbon precursor gas comprises a share of 20% to 80% of the overall gas flow.

7. The method according to claim 1, wherein the deposition of the carbon layer is performed so that the carbon layer comprises a graphite structure in a share of 20% to 90% of the carbon layer.

8. The method according to claim 1, further comprising forming at least one first layer interfacial layer between the carbon layer and the first layer.

9. The method according to claim 1, further comprising forming at least one second layer interfacial layer between the carbon layer and the second layer.

10. The method according to claim 1, wherein the first and the second layers are made of a semiconducting material.

11. The method according to claim 10, wherein the semiconducting material comprises silicon.

12. The method according to claim 1, wherein covering at least partially the carbon layer with a second layer is performed so that the second layer comprises a thickness between 10 nm to 100 nm forming a membrane, and so that the second layer is bendable in direction to the first layer, after the formation of the cavity structure.

13. The method according to claim 1, wherein the removing of the carbon layer by dry etching is performed by using an etchant that comprises an etch selectivity higher than 10 compared to the first and the second layers.

14. The method according to claim 1, wherein the deposition of the carbon layer is performed at a pressure between 90 Torr to 110 Torr.

15. The method according to claim 1, wherein the first and the second layer are made of an insulating material.

16. A method for fabricating a semiconductor structure comprising:
   providing an interstage semiconductor structure that comprises a semiconductor material and a sacrificial material; and
   removing the sacrificial material from the interstage semiconductor structure to form the semiconductor structure, wherein the sacrifical material is made of carbon deposited at a temperature between 700° C. to 900° C.

17. The method according to claim 16, wherein the removing of the sacrifical material is performed by dry etching.

18. A method for forming a cavity structure for a semiconductor device, the method comprising:
applying a chemical vapor deposition (CVD) to deposit a carbon layer on a first layer, wherein the chemical vapor deposition is performed at a temperature between 700° C. and 900° C. and at a pressure between 1 Torr and 500 Torr;
covering at least partially the carbon layer with a second layer so that the cavity structure is defined by an overlapping part of the second layer covering the carbon layer and the first layer; and
removing the carbon layer at least in the overlapping part by dry etching so that the cavity structure is formed.

19. A method for forming a cavity structure for a semiconductor microphone, the method comprising:
depositing a conductive first membrane layer on a main surface of a semiconductor substrate;
using chemical vapor deposition (CVD), depositing a carbon layer on the first membrane layer, wherein the chemical vapor deposition is performed at a temperature between 700° C. and 900° C. and at a pressure between 1 Torr to 500 Torr;
covering at least partially the carbon layer with a conductive second membrane layer so that the cavity structure for the semiconductor microphone is defined by an overlapping part of the second membrane layer covering the carbon layer and the first membrane layer; and
removing the carbon layer at least in the overlapping part by dry etching the carbon layer via openings so that the cavity structure for the semiconductor microphone arranged between the first and the second conductive membrane layers is formed.

20. The method according to claim 19, wherein the deposition of the carbon layer is performed using a carbon precursor gas diluted with nitrogen, wherein an overall gas flow is between 1 slm and 5 slm, and wherein the carbon precursor gas comprises a share of 20% to 80% of the overall gas flow.

21. The method according to claim 19, wherein the deposition of the first membrane layer is performed so that the first membrane layer comprises a thickness between 10 nm to 100 nm, wherein the deposition of the carbon layer is performed so that the carbon layer comprises a thickness between 1 μm and 4 μm and wherein the coverage of the carbon layer is performed with the second membrane layer comprising a thickness between 10 nm to 100 nm.

22. The method according to claim 19, further comprising forming bumps in a main surface of the carbon layer before covering at least partially the carbon layer with the second membrane layer.

23. The method according to claim 19, wherein the coverage of the carbon layer with the second membrane layer is performed so that a main surface of the carbon layer and side walls of the carbon layer are encapsulated by the second membrane layer and by the first membrane layer.

24. The method according to claim 19, further comprising forming at least an insulating interfacial layer between the semiconductor substrate and the first membrane layer.

25. The method according to claim 19, further comprising forming at least an interfacial layer arranged between the carbon layer and the second membrane layer.

* * * * *